(12) United States Patent
Utsuno

(10) Patent No.: US 8,653,865 B2
(45) Date of Patent: Feb. 18, 2014

(54) VOLTAGE CHANGE DETECTION DEVICE

(75) Inventor: Kikuo Utsuno, Miyazaki (JP)

(73) Assignee: LAPIS Semiconductor Co., Ltd. (JP)

( * ) Notice: Subject to any disclaimer, the term of this patent is extended or adjusted under 35 U.S.C. 154(b) by 354 days.

(21) Appl. No.: 12/912,192

(22) Filed: Oct. 26, 2010

(65) Prior Publication Data

US 2011/0148472 A1    Jun. 23, 2011

(30) Foreign Application Priority Data

Dec. 21, 2009    (JP) .................................. 2009-289255

(51) Int. Cl.
*H03L 7/00* (2006.01)
(52) U.S. Cl.
USPC ............... 327/143; 327/198; 327/51; 327/72; 327/77
(58) Field of Classification Search
USPC .............. 327/143, 198, 51, 52, 56, 72, 77–88
See application file for complete search history.

(56) References Cited

U.S. PATENT DOCUMENTS

| | | | |
|---|---|---|---|
| 5,942,921 A * | 8/1999 | Talaga, Jr. ..................... | 327/77 |
| 6,480,427 B2 * | 11/2002 | Kuriyama .................. | 365/189.11 |
| 6,888,381 B2 * | 5/2005 | Momtaz et al. ................. | 327/58 |
| 6,940,318 B1 * | 9/2005 | Wong .............................. | 327/77 |
| 6,989,692 B1 * | 1/2006 | Wong .............................. | 327/77 |
| 7,049,856 B2 * | 5/2006 | Momtaz et al. ................. | 327/58 |
| 7,349,190 B1 * | 3/2008 | Maheedhar et al. ............ | 361/92 |
| 7,504,874 B2 * | 3/2009 | Oehm .............................. | 327/513 |
| 7,911,263 B2 * | 3/2011 | Guo et al. ....................... | 327/544 |
| 8,193,854 B2 * | 6/2012 | Kuang et al. ................... | 327/539 |
| 2002/0186066 A1 | 12/2002 | Soda | |
| 2004/0189356 A1 * | 9/2004 | Wada ............................. | 327/143 |
| 2006/0125529 A1 * | 6/2006 | Laulanet et al. ................ | 327/77 |
| 2011/0148472 A1 * | 6/2011 | Utsuno .......................... | 327/88 |

(Continued)

FOREIGN PATENT DOCUMENTS

| | | |
|---|---|---|
| JP | S55-101058 A | 8/1980 |
| JP | S61-034471 A | 2/1986 |

(Continued)

OTHER PUBLICATIONS

An Office Action; "Notice of Rejection," issued by the Japanese Patent Office on Oct. 22, 2013, which corresponds to Japanese Patent Application No. 2009-289255 and is related to U.S. Appl. No. 12/912,192; with translation.

*Primary Examiner* — Adam Houston
(74) *Attorney, Agent, or Firm* — Studebaker & Brackett PC

(57) ABSTRACT

A voltage change detection device is provided, which can reduce a deviation of a detection potential and can detect a voltage change within a predetermined detection potential even when the threshold voltage of a field effect transistor is deviated. The voltage change detection device includes a first field effect transistor, a second field effect transistor, and a detection signal generator. The first field effect transistor has a drain connected to a power supply potential, a source connected to a first constant current source or a first resistor at a first node, and a gate connected to a fixed voltage. The second field effect transistor has a drain and a gate connected to the power supply potential and a source connected to a second constant current source or a second resistor at a second node. The detection signal generator generates a detection signal indicating that the power supply potential has crossed a predetermined detection potential according to a comparison between a voltage at the first node and a voltage at the second node.

10 Claims, 5 Drawing Sheets

(56) References Cited

U.S. PATENT DOCUMENTS

| | | | |
|---|---|---|---|
| 2011/0163799 A1* | 7/2011 | Kuang et al. | 327/539 |
| 2011/0298499 A1* | 12/2011 | Seol et al. | 327/77 |
| 2012/0013365 A1* | 1/2012 | Vilas Boas et al. | 327/72 |
| 2012/0044774 A1* | 2/2012 | Tran et al. | 365/189.07 |
| 2012/0049892 A1* | 3/2012 | Ueno | 327/72 |

FOREIGN PATENT DOCUMENTS

| | | |
|---|---|---|
| JP | H04-105190 A | 4/1992 |
| JP | H4-259113 A | 9/1992 |
| JP | 06-109781 | 4/1994 |
| JP | 2002-368581 A | 12/2002 |

* cited by examiner

VOLTAGE CHANGE DETECTION DEVICE

BACKGROUND OF THE INVENTION

1. Field of the Invention

The present invention relates to a voltage change detection device that detects whether or not a power supply voltage has changed to cross a predetermined detection potential.

2. Description of the Related Art

An apparatus for preventing a circuit from malfunctioning due to a reduction or increase of a power supply potential below or above a predetermined potential (throughout the specification, the term "potential" stands for electrical potential) is known in the art. See, for example, Japanese Patent Kokai No. H06-109781 (Patent Literature 1).

FIG. 1 is a circuit diagram of a conventional voltage change detection device 90. A drain of a DMOS 91 which is a depletion type NMOS field effect transistor is connected to a power supply potential VDD and a gate and a source thereof are connected to each other at a node S1. A source of an NMOS 92 which is an NMOS field effect transistor is connected to a ground potential VSS and a gate and a drain thereof are connected to each other at a node S2. The node S1 and the node S2 are connected to each other and the node S2 is connected to one input of a comparator 95. A drain and a gate of an NMOS 93 which is an NMOS field effect transistor are connected to the power supply potential VDD and a source thereof is connected to a node S3. A source and a gate of a DMOS 94 which is a depletion type NMOS field effect transistor are connected to the ground potential VSS and a drain thereof is connected to the node S3. The node S3 is connected to the other input of the comparator 95. The comparator 95 compares a reference potential REF1 provided to the one input thereof and a comparison potential REF2 provided to the other input thereof and changes the voltage level of an output OUT thereof from VDD to 0V when the comparison potential REF2 is higher than the reference potential REF1.

FIG. 2 illustrates a relationship between the reference potential, the comparison potential, and the detection potential in the conventional voltage change detection device 90. The vertical axis represents voltage and the horizontal axis represents the power supply potential VDD. The reference potential REF1 is a threshold voltage of the NMOS 92. Here, the threshold voltage is a voltage between the source and gate which allows conduction between the drain and source of the NMOS 92 or allows a constant current to flow therebetween. The term "threshold voltage" used in the following description has the same meaning as this threshold voltage. The threshold voltage of the NMOS 92 may vary due to manufacturing deviation or temperature changes. In FIG. 2, a reference potential REF1 of the NMOS 92 whose threshold voltage is high is shown as a reference potential R1H and a reference potential REF1 of the NMOS 92 whose threshold voltage is low is shown as a reference potential R1L. The reference potential R1H is higher than the reference potential R1L since the reference potential REF1 increases as the threshold voltage of the NMOS 92 increases. The DMOS 91 serves as a high resistor so that the reference potentials R1H and R1L undergo almost no change as the power supply potential VDD changes.

The comparison potential REF2 is lower than the power supply potential VDD by the threshold voltage of the NMOS 93. The threshold voltage of the NMOS 93 may also deviate due to manufacturing deviation or the like. In FIG. 2, a comparison potential REF2 of the NMOS 93 whose threshold voltage is high is shown as a comparison potential R2H and a comparison potential REF2 of the NMOS 93 whose threshold voltage is low is shown as a comparison potential R2L. The comparison potential REF2 decreases as the threshold voltage of the NMOS 93 increases since the comparison potential REF2 is lower than the power supply potential VDD by the threshold voltage of the NMOS 93. Conversely, the comparison potential REF2 increases as the threshold voltage of the NMOS 93 decreases. Therefore, the comparison potential R2H is lower than the comparison potential R2L. The DMOS 94 serves as a high resistor so that the comparison potentials R2H and R2L increase as the power supply potential VDD increases and decrease as the power supply potential VDD decreases.

The threshold voltage of the NMOS 92 and the threshold voltage of the NMOS 93 change in the same direction due to manufacturing deviation or the like. When the threshold voltage deviates upward, the reference potential REF1 increases while the comparison potential REF2 decreases. When the threshold voltage deviates downward, the reference potential REF1 decreases while the comparison potential REF2 increases. In this manner, the reference potential REF1 and the comparison potential REF2 change in opposite directions. Thus, there is a great difference between a detection potential VH1 of the comparator 95 when the threshold voltage is high and a detection potential VH2 thereof when the threshold voltage is low.

The following problems occur when the deviation of the detection potential becomes large. For example, when the detection potential is deviated upward, the voltage change detection device changes the voltage level of the output OUT to a level higher than a desired detection potential, thereby causing a problem in that the operation of a voltage detection target circuit (not shown) is stopped even when battery power remains and is still able to supply a sufficient power supply potential. On the other hand, when the detection potential is deviated downward, the voltage change detection device changes the voltage level of the output OUT to a level lower than the desired detection potential, thereby causing a problem in that a voltage lower than the operation-guaranteed voltage is provided to the circuit and thus the circuit does not operate normally.

FIG. 3 illustrates a relationship between temperature and a detection potential of the voltage change detection device 90. The vertical axis represents detection potential and the horizontal axis represents temperature. In FIG. 3, the threshold voltage of the NMOS is denoted by a symbol "TT" when it is standard, "SS" when it is high, and "FF" when it is low and the threshold voltage of the DMOS is denoted by a symbol "DS" when it is high and "DF" when it is low. An upper limit value of a desired detection potential is denoted by "upper limit" and a lower limit value thereof is denoted by "lower limit". For example, the upper limit value is an upper limit of the operating voltage of a voltage detection target IC circuit and the lower limit value is a lower limit thereof. The upper limit value is 1.3V and the lower limit value is 1.0V.

Since the comparator 95 changes the voltage level of the output OUT when the comparison potential REF2 is higher than the reference potential REF, the detection potential is obtained as follows. When the drain-source voltage of the NMOS 92 is denoted by "Vt1" and the drain-source voltage of the NMOS 93 is denoted by "Vt2", VDD−Vt2>Vt1 since comparison potential REF2>reference potential REF1. This can be rewritten as VDD>Vt1+Vt2. That is, the comparator 95 changes the voltage level of the output OUT when VDD is higher than Vt1+Vt2. Thus, the value of Vt1+Vt2 is the detection potential, and the comparator 95 detects whether or not the power supply potential VDD has changed to cross this detection potential. Since the detection potential is the sum of the drain-source voltage of the NMOS 92 and the drain-source voltage of the NMOS 93, deviation of the detection potential increases when the threshold voltages of the NMOS 92 and the NMOS 93 have deviated due to temperature and/or manufacturing conditions. As shown in FIG. 3, the detection potential is higher than the upper limit when the threshold voltage is high as denoted by a symbol "SS" depending on temperature and is lower than the lower limit when the threshold voltage is low as denoted by a symbol "FF". Thus, the detection potential may not be detected within the desired detection potential due to deviation in the threshold voltage.

In the case where the conventional voltage change detection device is used, deviation in the detection potential is increased when the threshold voltage of a field effect transistor is deviated due to manufacturing deviation or the like and the detection potential cannot be detected within a desired detection potential, thereby causing malfunction or the like of a voltage detection target IC circuit.

SUMMARY OF THE INVENTION

Therefore, the present invention has been made in view of the above problems, and it is an object of the present invention to provide a voltage change detection device which can reduce a deviation of a detection potential and can detect a voltage change within a desired detection potential even when the threshold voltage of a field effect transistor is deviated.

In accordance with an aspect of the present invention, the above and other objects can be accomplished by the provision of a voltage change detection device including a reference potential generator that generates a reference potential based on a power supply potential, a comparison potential generator that generates a comparison potential based on the power supply potential, and a detection signal generator that generates a detection signal indicating that the power supply potential has changed to cross a predetermined detection potential according to a comparison between the reference potential and the comparison potential, wherein the reference potential generator includes a first constant current source or a first resistor connected to a ground potential and a first field effect transistor having a drain connected to the power supply potential, a source connected to the first constant current source or the first resistor at a first node, and a gate connected to a fixed voltage, wherein the comparison potential generator includes a second constant current source or a second resistor connected to the ground potential and a second field effect transistor having a drain and a gate connected to the power supply potential and a source connected to the second constant current source or the second resistor at a second node, and wherein the detection signal generator generates the detection signal using a voltage at the first node as the reference potential and using a voltage at the second node as the comparison potential.

In accordance with another aspect of the present invention, there is provided a voltage change detection device including a reference potential generator that generates a reference potential based on a power supply potential, a comparison potential generator that generates a comparison potential based on the power supply potential, and a detection signal generator that generates a detection signal indicating that the power supply potential has changed to cross a predetermined detection potential according to a comparison between the reference potential and the comparison potential, wherein the reference potential generator includes a first constant current source or a first resistor connected to a ground potential and a first field effect transistor having a drain connected to the power supply potential, a source connected to the first constant current source or the first resistor at a first node, and a gate connected to a fixed voltage, wherein the comparison potential generator includes a second constant current source or a second resistor connected to the ground potential, at least two second field effect transistors, each having a source connected to the second constant current source or the second resistor at a second node, and at least two switches connected between the power supply potential and respective gates and drains of the second field effect transistors, and wherein the detection signal generator generates the detection signal using a voltage at the first node as the reference potential and using a voltage at the second node as the comparison potential.

The voltage change detection device described above can reduce a deviation of a detection potential and can detect a voltage change within a predetermined detection potential even when the threshold voltage of a field effect transistor is deviated.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Embodiments of the present invention will now be described in detail with reference to the accompanying drawings.

Figure 1:
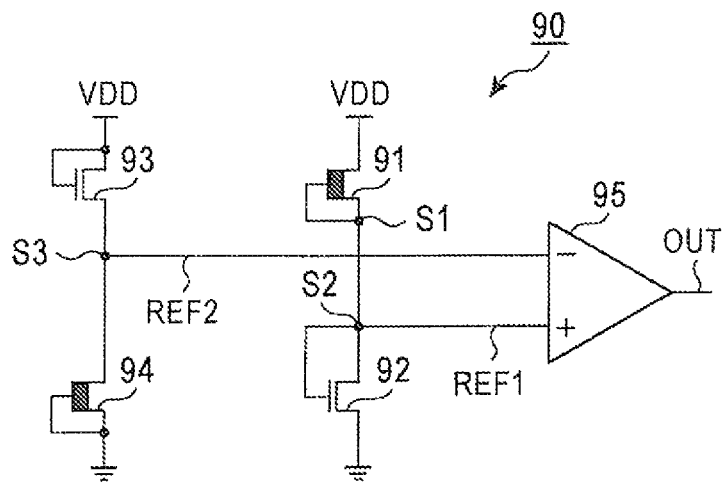
FIG. 1 is a circuit diagram of a conventional voltage change detection device.
Figure 2:
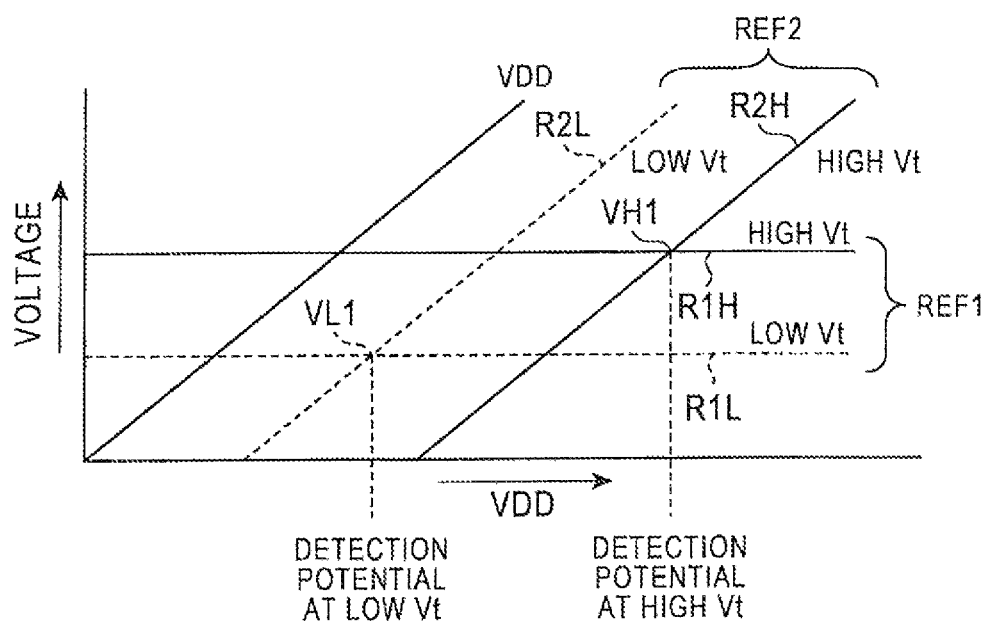
FIG. 2 illustrates a relationship between a reference potential, a comparison potential, and a detection potential in the voltage change detection device of FIG. 1.
Figure 3:
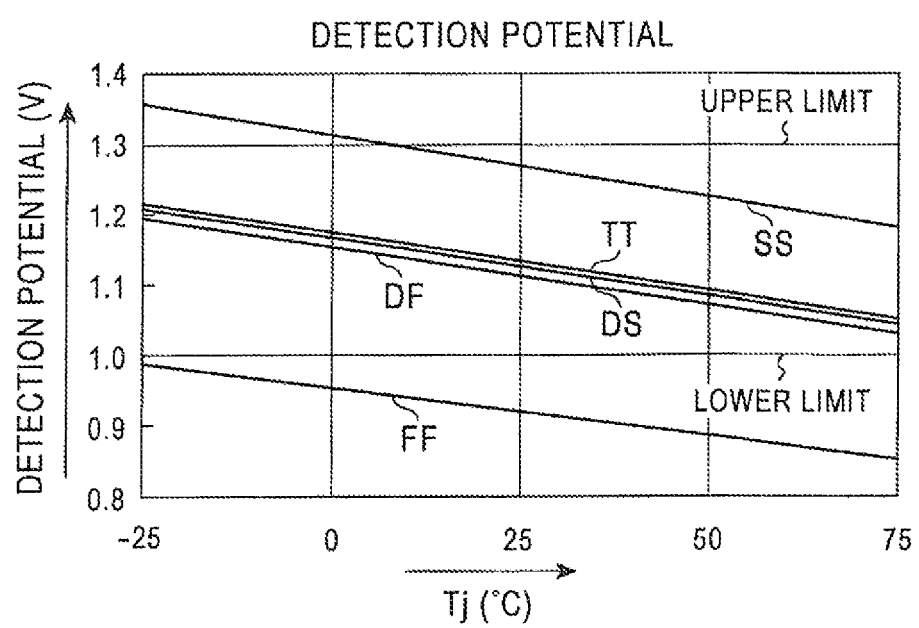
FIG. 3 illustrates a relationship between temperature and a detection potential of the voltage change detection device of FIG. 1.
Figure 4:
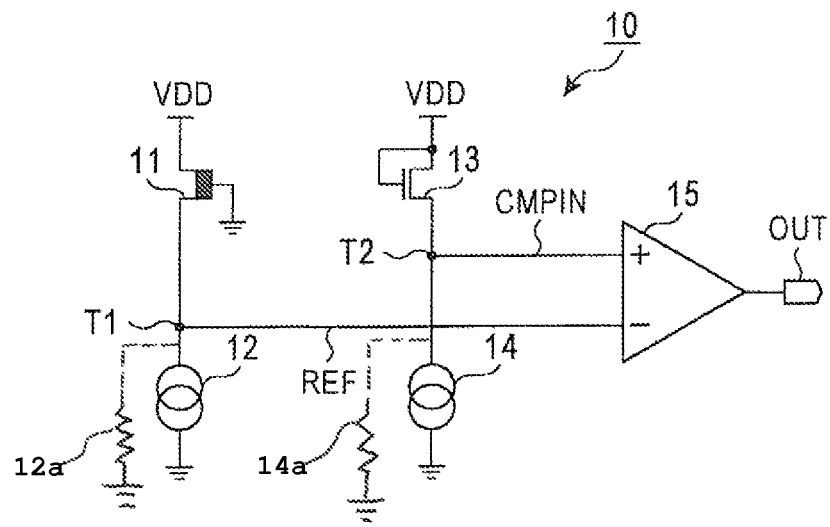
FIG. 4 is a circuit diagram of a voltage change detection device according to a first embodiment.

FIG. 4 is a circuit diagram of a voltage change detection device 10 according to a first embodiment. The voltage change detection device 10 is used to detect a change in a power supply potential VDD provided to an IC circuit (not shown) for operating, for example, a device such as a mobile phone. For example, the voltage change detection device 10 changes the voltage level of its output OUT, for example, when the power supply potential VDD has exceeded a desired upper limit voltage. It is possible to prevent malfunction or breakdown of components of the IC circuit by stopping operation of the IC circuit or a power supply based on the voltage change.

A drain of a DMOS 11 which is a depletion type NMOS field effect transistor (corresponding to the first field effect transistor) is connected to a power supply potential VDD, a gate thereof is connected to a ground potential, and a source thereof is connected to a constant current source 12 (corresponding to the first constant current source) through a node T1. The node T1 (corresponding to the first node) is connected to one input of a comparator 15. In the following description, a unit including the DMOS 11 and the constant current source 12 is referred to as a "reference potential generator". A drain and a gate of an NMOS 13 which is an enhancement type NMOS field effect transistor (corresponding to the second field effect transistor) are connected to the power supply potential VDD and a source thereof is connected to a constant current source 14 (corresponding to the second constant current source) through a node T2 (corresponding to the second node). The node T2 is connected to the other input of the comparator 15. In the following, a unit including the NMOS 13 and the constant current source 14 is referred to as a "comparison potential generator". The comparator 15 compares a reference potential REF provided to the one input thereof and a comparison potential CMPIN provided to the other input thereof and changes the voltage level of an output OUT thereof, for example, from 0V to VDD when the comparison potential CMPIN has become higher than the reference potential REF.

Figure 5:
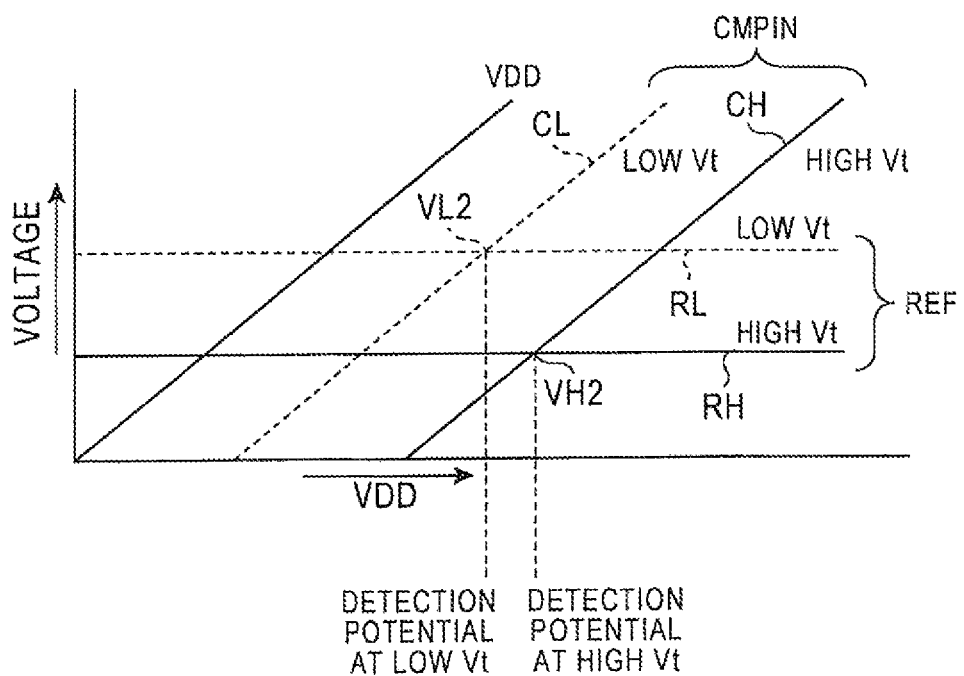
FIG. 5 illustrates a relationship between a reference potential, a comparison potential, and a detection potential in the voltage change detection device of FIG. 4.

FIG. 5 illustrates a relationship between the reference potential, the comparison potential, and the detection potential in the voltage change detection device 10. The vertical axis represents voltage and the horizontal axis represents the power supply potential VDD. The reference potential REF is lower than the gate voltage of the DMOS 11, i.e., VSS (=0V), by the threshold voltage of the DMOS 11. For example, when the threshold voltage of the DMOS 11 is −0.6V, the reference potential REF is 0.6V (=0V−(−0.6V)). The threshold voltage of the DMOS 11 deviates due to manufacturing deviation, temperature changes, or the like. In FIG. 5, a reference potential REF of the DMOS 11 whose threshold voltage is high is shown as a reference potential RH and a reference potential REF of the DMOS 11 whose threshold voltage is low is shown as a reference potential RL. The reference potential REF decreases as the threshold voltage of the DMOS 11 increases. For example, if the threshold voltage of the DMOS 11 is deviated upward to, for example, −0.4V when the standard value of the threshold voltage of the DMOS 11 is −0.6V, the reference potential REF is 0.4V (=0V−(−0.4V)). That is, the reference potential REF decreases as the threshold voltage is deviated upward. Conversely, the reference potential REF increases as the threshold voltage of the DMOS 11 decreases. For example, if the threshold voltage of the DMOS 11 is deviated downward to, for example, −0.8V when the standard value of the threshold voltage of the DMOS 11 is −0.6V, the reference potential REF is 0.8V (=0V−(−0.8V)). That is, the reference potential REF increases as the threshold voltage decreases. Therefore, the reference potential RL is higher than the reference potential RH. The source of the DMOS 11 is connected to the constant current source 12 so that the reference potentials RH and RL undergo almost no change as the power supply potential VDD changes.

The comparison potential CMPIN is lower than the power supply potential VDD by the threshold voltage of the NMOS 13. When the power supply potential VDD is, for example, 1.0V and the threshold voltage of the NMOS 13 is, for example, 0.6V, the comparison potential CMPIN is 0.4V (=1.0V−(0.6V)). The threshold voltage of the NMOS 13 deviates due to manufacturing deviation or the like. In FIG. 5, a comparison potential CMPIN of the NMOS 13 whose threshold voltage is high is shown as a comparison potential CH and a comparison potential CMPIN of the NMOS 13 whose threshold voltage is low is shown as a comparison potential CL. The comparison potential CMPIN decreases as the threshold voltage of the NMOS 13 increases since the comparison potential CMPIN is lower than VDD by the threshold voltage of the NMOS 13. Conversely, the comparison potential CMPIN increases as the threshold voltage of the NMOS 13 decreases. Therefore, the comparison potential CH is lower than the comparison potential CL. The drain of the NMOS 13 is connected to the constant current source 14 so that the comparison potentials CH and CL increase as the power supply potential VDD increases and decrease as the power supply potential VDD decreases.

The comparator 15 compares the reference potential REF and the comparison potential CMPIN, and a point of intersection between the reference potential RH and the comparison potential CH is a detection potential VH2 and a point of intersection between the reference potential RL and the comparison potential CL is a detection potential VL2.

The threshold voltage of the DMOS 11 and the threshold voltage of the NMOS 13 deviate in the same direction since a DMOS is obtained by performing implantation for depletion on an NMOS. When the threshold voltage is deviated upward, both the reference potential REF and the comparison potential CMPIN are lowered. On the other hand, when the threshold voltage is deviated downward, both the reference potential REF and the comparison potential CMPIN are raised. Thus, the reference potential REF and the comparison potential CMPIN vary in the same direction when the threshold voltage has varied. Therefore, the difference between the detection potential VH2 of the comparator 15 when the threshold voltage is high and the detection potential VL2 thereof when the threshold voltage is low is smaller than in the conventional technology.

Figure 6:
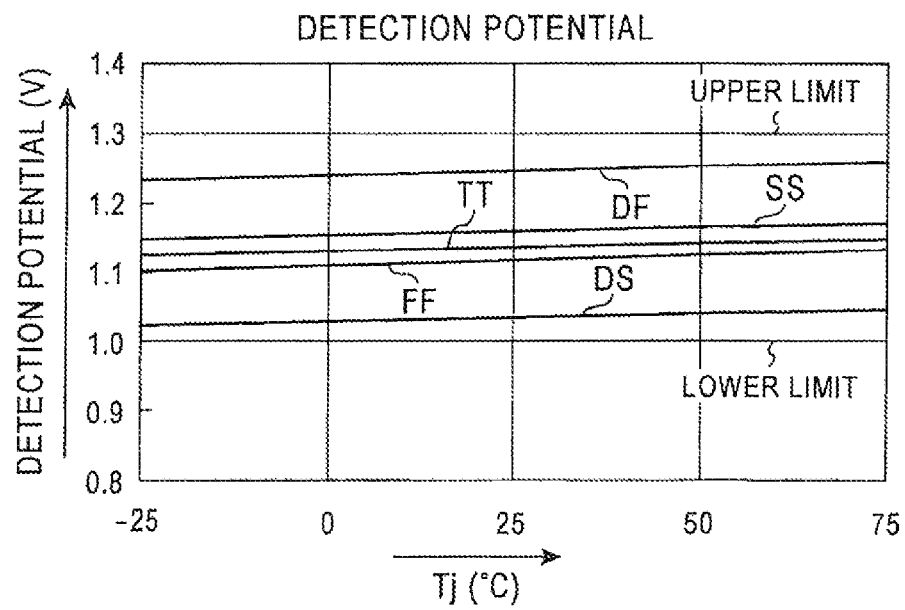
FIG. 6 illustrates a relationship between temperature and a detection potential of the voltage change detection device of FIG. 4.

FIG. 6 illustrates a relationship between temperature and a detection potential of the voltage change detection device 10. The vertical axis represents detection potential and the horizontal axis represents temperature. In FIG. 6, the threshold voltage is denoted by a symbol "TT" when it is standard, "SS" when it is high, and "FF" when it is low and the threshold voltage of the DMOS is denoted by a symbol "DS" when it is high and "DF" when it is low. An upper limit value of a desired detection potential is denoted by "upper limit" and a lower limit value thereof is denoted by "lower limit". For example, the upper limit value is an upper limit of the operating voltage of a voltage detection target IC circuit and the lower limit value is a lower limit thereof. The upper limit value is, for example, 1.3V and the lower limit value is, for example, 1.0V.

Since the comparator 15 changes the voltage level of the output OUT when the comparison potential CMPIN is higher than the reference potential REF, the detection potential is obtained as follows. When the threshold voltage of the NMOS 13 is denoted by "Vtn" and the threshold voltage of the DMOS 11 is denoted by "Vtd", VDD−Vtn>VSS (0V)−Vtd since comparison potential CMPIN>reference potential REF. This can be rewritten as VDD>Vtn−Vtd. That is, the comparator 15 changes the voltage level of the output OUT when VDD is higher than Vtn−Vtd. The value of Vtn−Vtd is the detection potential. Thus, the comparator 15 is a detection signal generator that generates a detection signal indicating that the power supply potential VDD has changed to cross the desired detection potential Vtn−Vtd (i.e., that the power supply potential has exceeded the detection potential in this example) through change of the voltage of the output OUT as described above. For example, the detection potential is 1.15V (=0.55V−(−0.6V)) when Vtn=0.55V and Vtd=−0.6V. As shown in FIG. 6, the detection potential falls within a desired detection potential, regardless of temperature, both when the threshold voltage of the DMOS is deviated upward as denoted by a symbol "DS" and when the threshold voltage is deviated downward as denoted by a symbol "DF".

The voltage change detection apparatus according to this embodiment uses a depletion type MOS whose threshold value is negative to generate a reference potential as described above. In addition, the gate is connected to the ground potential such that the direction of the comparison potential change becomes the same as the direction of the reference potential change by a deviation in the threshold voltage that has occurred due to manufacturing conditions, or the like. Therefore, it is possible to significantly reduce the difference between the detection potential of the comparator when the threshold voltage is high and the detection potential when the threshold voltage is low, compared to the conventional technology. In addition, it is possible to detect a detection potential within a desired detection potential even when the threshold voltage has changed due to a temperature change.

The conventional voltage change detection device may not be able to detect the detection potential when it is not above the desired detection potential due to deviation in the threshold voltage. In this case, there is a problem in that the operation of a voltage detection target circuit (not shown) is stopped even when battery power remains and still supplies a sufficient power supply potential. In addition, the conventional voltage change detection device may not be able to detect the detection potential if it is not below the desired detection potential due to deviation of the threshold voltage. In this case, there is a problem in that a voltage lower than the operation-guaranteed voltage is provided to the circuit and thus the circuit does not operate normally. On the other hand, the voltage change detection device according to this embodiment reduces the difference of threshold voltages due to deviation of the threshold voltages and also can detect a detection potential within the desired detection potential, thereby overcoming the above problems.

When the MOS is provided at the ground potential side as in the conventional voltage change detection device, a current of about 1 μA flows through the MOS when the gate length of the MOS at the ground potential side is 10 μm. On the other hand, in the voltage change detection device according to this embodiment, a current of 2 nA can flow through the MOS when the gate length of the MOS at the power supply potential side is 10 μm since a constant current source rather than the MOS is provided at the ground potential side. Thus, the voltage change detection device according to this embodiment also has an advantage in that current consumption is significantly reduced. In the conventional voltage change detection device, there is a need to increase the gate length of the MOS to about 1000 μm in order to reduce the current to about 2 nA, resulting in an increase in the size of the circuitry. On the other hand, using the constant current source, the voltage change detection device according to this embodiment can reduce current flowing through the MOS without increasing the circuitry size.

The voltage change detection device according to this embodiment can be manufactured using general semiconductor manufacturing technologies. In addition, in the voltage change detection device according to this embodiment, it is not necessary to connect the gate of the depletion type MOS to the ground potential VSS and it is possible to appropriately set the gate thereof to another fixed voltage based on a relationship between the power supply potential and the threshold voltage. Further, the voltage change detection device according to the present invention can reduce variation in the detection potential even when a resistor is used in place of the constant current source. Such a resistor is shown in broken line drawing as resistors 12a and 14a, which optionally replaces current sources 12 and 14, respectively in FIG. 4, and resistors 30a and 31a, which optionally replaces current sources 30 and 31, respectively. In addition, in the voltage change detection device according to the present invention, the comparator may also change the voltage level of the output OUT when the comparison potential CMPIN is lower than the reference potential REF, conversely to the example described above. In this case, it is also possible to prevent malfunction or the like of the IC circuit by stopping the operation of the IC circuit or power source based on the voltage change.

As described above, according to the voltage change detection device of this embodiment, it is possible to reduce deviation of the detection potential and to detect a voltage change within the desired detection potential even when the threshold voltage of the field effect transistor is deviated.

Second Embodiment

Figure 7:
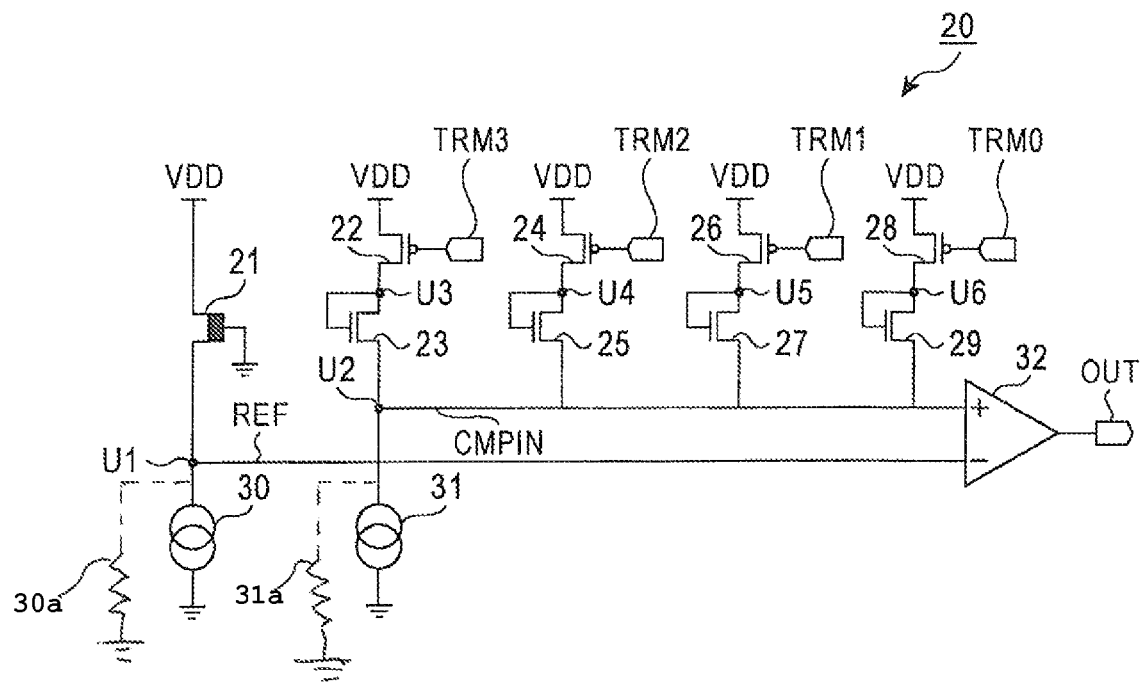
FIG. 7 is a circuit diagram of a voltage change detection device according to a second embodiment.

FIG. 7 is a circuit diagram of a voltage change detection device 20 according to a second embodiment. The voltage change detection device 20 is designed so as to individually adjust detection potentials according to the level of the threshold voltage of a DMOS 21.

A drain of the DMOS 21 which is a depletion type NMOS field effect transistor (corresponding to the first field effect transistor) is connected to a power supply potential VDD, a gate thereof is connected to a ground potential, and a source thereof is connected to a constant current source 30 (corresponding to the first constant current source) through a node U1 (corresponding to the first node).

A drain and a gate of an NMOS 23, which is an enhancement type NMOS field effect transistor (corresponding to the second field effect transistor and being referred to hereinafter as an "NMOS" for short), are connected to each other at a node U3 and a source thereof is connected to a constant current source 31 (corresponding a second constant current source) through a node U2 (corresponding to the second node). The node U3 is connected to the power supply potential VDD through a PMOS 22. The PMOS 22 is a PMOS field effect transistor (hereinafter referred to as a "PMOS" for short) that operates as a switch which is turned on or off according to a trimming signal TRM3 (hereinafter referred to as a "signal" for short). A source of the PMOS 22 is connected to the power supply potential VDD and a drain thereof is connected to the node U3, and a gate thereof receives the signal TRM3.

A drain and a gate of an NMOS 25 are connected to each other at a node U4 and a source thereof is connected to the constant current source 31 through the node U2. The node U4 is connected to the power supply potential VDD through a PMOS 24. The PMOS 24 operates as a switch that is switched on or off according to a signal TRM2. A source of the PMOS 24 is connected to the power supply potential VDD and a drain thereof is connected to a node U4 and a gate thereof receives the signal TRM2.

A drain and a gate of an NMOS 27 are connected to each other at a node U5 and a source thereof is connected to the constant current source 31 through the node U2. The node U5 is connected to the power supply potential VDD through a PMOS 26. The PMOS 26 operates as a switch that is switched on or off according to a signal TRM1. A source of the PMOS 26 is connected to the power supply potential VDD and a drain thereof is connected to the node U5 and a gate thereof receives the signal TRM1.

A drain and a gate of an NMOS 29 are connected to each other at a node U6 and a source thereof is connected to the constant current source 31 through the node U2. The node U6 is connected to the power supply potential VDD through a PMOS 28. The PMOS 28 operates as a switch that is switched on or off according to a signal TRM0. A source of the PMOS 28 is connected to the power supply potential VDD and a drain thereof is connected to the node U6 and a gate thereof receives the signal TRM0.

The node U1 is connected to one input of the comparator 32. The node U2 is connected to the other input of the comparator 32. The comparator 32 compares a reference potential REF provided to the one input and a comparison potential CMPIN provided to the other input and changes voltage of the output OUT, for example, from 0V to VDD, when the comparison potential CMPIN is higher than the reference potential REF.

The NMOS 23, 25, 27, and 29 have different threshold voltages. The NMOS 23, the NMOS 25, the NMOS 27, and the NMOS 29 are in increasing order of threshold voltage. For example, it is possible to achieve this threshold voltage relationship between the NMOSs 23, 25, 27, and 29 by designing the NMOSs such that their gate widths are the same and the NMOS 23, the NMOS 25, the NMOS 27, and the NMOS 29 are numbered in increasing order of gate length.

Alternatively, it is possible to achieve the above threshold voltage relationship by designing the NMOSs such that their gate lengths are the same and the NMOS 23, the NMOS 25, the NMOS 27, and the NMOS 29 are numbered in decreasing order of gate width.

In the voltage change detection device 20, it is possible to select one NMOS connected in series to one of the PMOSs 22, 24, 26, and 28 by bringing only one of the signals TRM0 to TRM3 corresponding to the one PMOS to a low level (i.e., 0V) to turn on the one PMOS. It is possible to adjust the detection potential through this selection.

Figure 8:
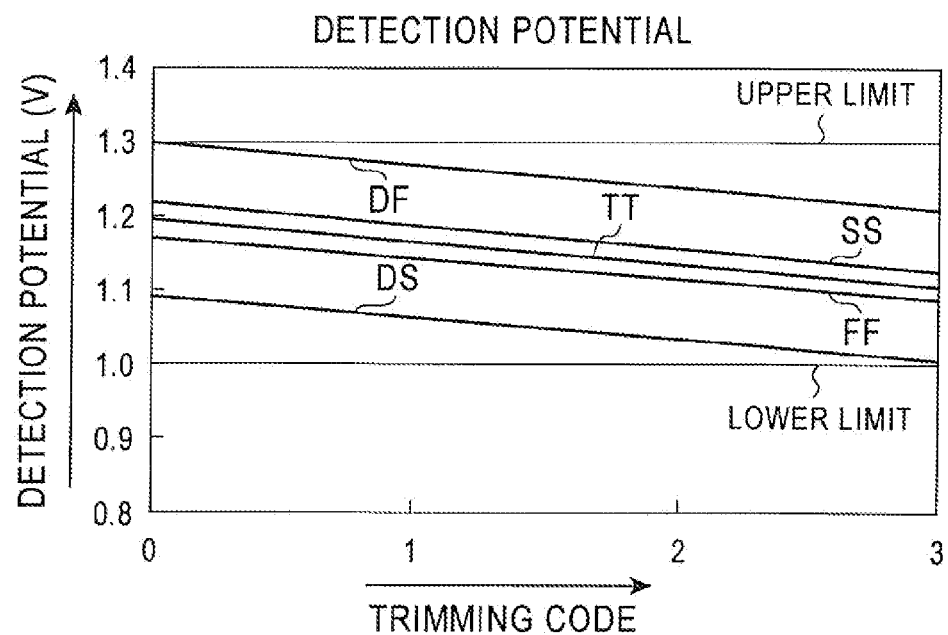
FIG. 8 illustrates a relationship between a trimming code and a detection potential in the voltage change detection device of FIG. 7.

FIG. 8 illustrates a relationship between a trimming code and a detection potential in the voltage change detection device 20. The vertical axis represents detection potential and the horizontal axis represents trimming code. When the detection potential is considered in the same manner as described above in the first embodiment, the detection potential is expressed by the difference (i.e., Vtn−Vtd) between the threshold voltage Vtn of the NMOS selected using the signals TRM0 to TRM3 and the threshold voltage Vtd of the DMOS 21. The trimming code represents the number of a trimming signal that is at a low level (0V). For example, the detection potential when only the signal TRM0 is at a low level (0V) is shown at a position of "0" on the horizontal axis. In FIG. 8, the threshold voltage is denoted by a symbol "TT" when it is standard, "SS" when it is high, and "FF" when it is low and the threshold voltage of the DMOS is denoted by a symbol "DS" when it is high and "DF" when it is low. An upper limit value of a desired detection potential is denoted by "upper limit" and a lower limit value thereof is denoted by "lower limit". For example, the upper limit value is an upper limit of the operating voltage of a voltage detection target IC circuit and the lower limit value is a lower limit thereof. The upper limit value is, for example, 1.3V and the lower limit value is, for example, 1.0V.

The reference potential REF is raised, for example, when the threshold voltage of the DMOS 21 is deviated downward. Therefore, the detection potential is increased, compared to when a standard DMOS is used. Thus, the drain-source voltage of the NMOS is lowered so that the detection potential falls within the desired detection potential. Specifically, the signal TRM3 is set to a low level (0V) and the signals TRM0 to TRM2 are set to a high level (VDD). That is, only the NMOS 23 is selected. The drain-source voltage of the NMOS is lowered since the threshold voltage of the NMOS 23 is lower than the threshold voltages of the NMOSs 25, 27, and 29. Since the drain-source voltage of the NMOS is lowered when the threshold voltage Vtd of the DMOS 21 has been lowered, it is possible to allow the detection potential (Vtn−Vtd) to fall within the desired detection potential.

When the threshold voltage of the DMOS in a standard sample is, for example, −0.6V and the threshold voltage of the NMOS is, for example, 0.55V, a standard detection potential is 1.15V (=0.55V−(−0.6V)). Here, when the threshold voltage Vtd of the DMOS 21 is deviated downward to −0.8V, only the NMOS 23 is selected to reduce the voltage Vtn to, for example, 0.35V, as described above. In this manner, the detection potential can be adjusted to 1.15V (=0.35V−(−0.8V)).

On the other hand, the reference potential REF is lowered when the threshold voltage of the DMOS 21 is deviated upward. Therefore, the detection potential is decreased, compared to when the standard DMOS is used. Thus, the drain-source voltage of the NMOS is increased so that the detection potential falls within the desired detection potential. Specifically, the signal TRM0 is set to a low level (0V) and the signals TRM1 to TRM3 are set to a high level (VDD). That is, only the NMOS 29 is selected. The drain-source voltage of the NMOS is increased since the threshold voltage of the NMOS 29 is higher than the threshold voltages of the NMOSs 23, 25, and 27. Since the drain-source voltage of the NMOS is increased when the threshold voltage Vtd of the DMOS 21 has been increased, it is possible to allow the detection potential (Vtn−Vtd) to fall within the desired detection potential.

When the threshold voltage of the DMOS in a standard sample is, for example, −0.6V and the threshold voltage of the NMOS is, for example, 0.55V, a standard detection potential is 1.15V (=0.55V−(−0.6V)). Here, when the threshold voltage Vtd of the DMOS 21 is deviated upward to −0.4V, only the DMOS 21 is selected to increase the voltage Vtn to, for example, 0.75V, as described above. In this manner, the detection potential can be adjusted to 1.15V (=0.75V−(−0.4V)).

It is possible to adjust the detection potential in the same manner by selecting the NMOS 25 or the NMOS 27. That is, it is possible to adjust the detection potential by selecting one of the NMOSs 23, 25, 27, and 29 that have different threshold voltages according to deviation of the threshold voltage of the DMOS 21 as described above. As shown in FIG. 8, the detection potential falls within a desired detection potential both when the threshold voltage of the DMOS 21 is deviated upward as denoted by a symbol "DS" and when the threshold voltage is deviated downward as denoted by a symbol "DF".

Figure 9:
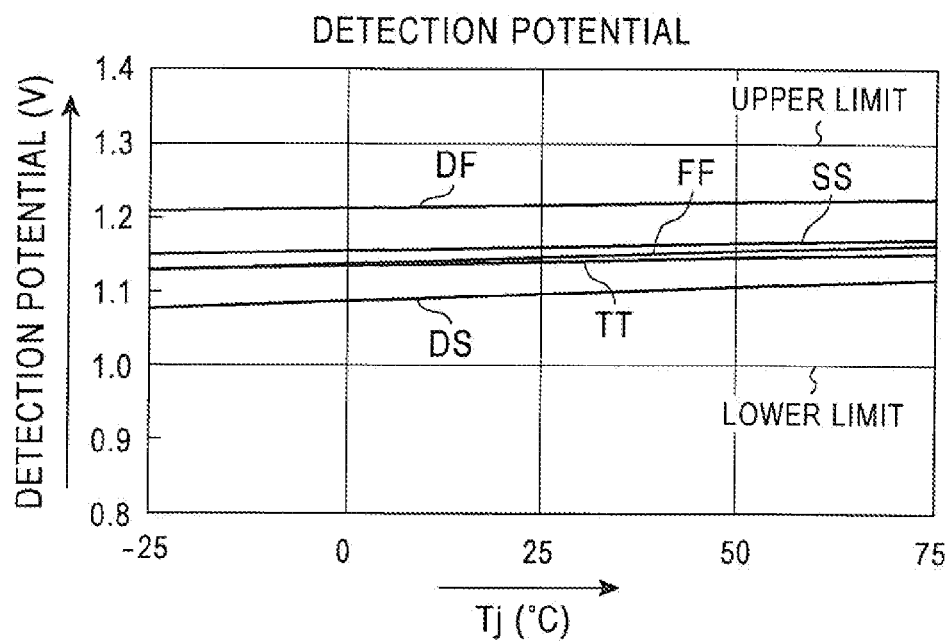
FIG. 9 illustrates a relationship between temperature and a detection potential in the voltage change detection device of FIG. 7.

FIG. 9 illustrates a relationship between temperature and a detection potential in the voltage change detection device 20. The vertical axis represents detection potential and the horizontal axis represents temperature. In FIG. 9, the threshold voltage is denoted by a symbol "TT" when it is standard, "SS" when it is high, and "FF" when it is low and the threshold voltage of the DMOS is denoted by a symbol "DS" when it is high and "DF" when it is low. An upper limit value of a desired detection potential is denoted by "upper limit" and a lower limit value thereof is denoted by "lower limit". The upper limit value is, for example, 1.3V and the lower limit value is, for example, 1.0V. As shown in FIG. 9, the detection potential falls within a desired detection potential, regardless of temperature, both when the threshold voltage of the DMOS is deviated upward as denoted by a symbol "DS" and when the threshold voltage is deviated downward as denoted by a symbol "DF".

As described above, the voltage change detection device according to this embodiment allows the detection potential to fall within a desired detection potential by selecting one of a plurality of NMOSs having different threshold voltages according to a deviation of the threshold voltage of the DMOS that has occurred due to manufacturing conditions. That is, this embodiment allows each individual voltage change detection device to be appropriately set.

Even when the threshold voltage of a field effect transistor is deviated, the voltage change detection device of this embodiment can reduce a variation in the detection potential and can detect a voltage change within a desired detection potential as described above.

Although the voltage change detection device of this embodiment has been described with reference to an example wherein the voltage change detection device includes four sets of an NMOS, a PMOS, and a trimming signal (which are hereinafter referred to as an "NMOS and the like" for short), the present invention is not limited to this example and the voltage change detection device may include two or more sets of an NMOS and the like. For example, the voltage change detection device may include two sets of an NMOS and the like so that it is possible to adjust the detection potential in two steps and the voltage change detection device may also include 10 sets of an NMOS and the like so that it is possible to more finely adjust the detection potential. In this case, the NMOSs also have different threshold voltages. In addition, although the voltage change detection device of this embodiment has been described with reference to an example wherein one of the four sets of an NMOS and the like is selected, the present invention is not limited to this example and two or more sets of an NMOS and the like may be selected. In this case, the selected NMOSs and the like are connected to each other in parallel and a comparison potential is determined based on the threshold voltages of the selected NMOSs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

This application is based on Japanese Patent Application No. 2009-289255 which is herein incorporated by reference.

What is claimed is:

1. A voltage change detection device comprising:
   a reference potential generator adapted to generate a reference potential based on a power supply potential;
   a comparison potential generator adapted to generate a comparison potential based on the power supply potential; and
   a detection signal generator that generates adapted to generate a detection signal indicating that the power supply potential has changed to cross a predetermined detection potential according to a comparison between the reference potential and the comparison potential,
   wherein the reference potential generator includes one of a first resistor and a first constant current source connected to a ground potential and a first field effect transistor having a drain connected to the power supply potential, a source connected to the one of the first resistor and the first constant current source at a first node, and a gate connected to a fixed voltage,
   wherein the comparison potential generator includes one of a second resistor and a second constant current source connected to the ground potential and a second field effect transistor having a drain and a gate connected to the power supply potential and a source connected to the one of the second resistor and the second constant current source at a second node, and
   wherein the detection signal generator generates the detection signal using a voltage at the first node as the reference potential and using a voltage at the second node as the comparison potential,
   wherein the fixed voltage is the ground potential.

2. The voltage change detection device according to claim 1, wherein the first field effect transistor is a depletion type NMOS transistor and the second field effect transistor is an enhancement type NMOS transistor.

3. The voltage change detection device according to claim 1, wherein the voltage change detection device generates the detection signal when the comparison potential is higher than the reference potential.

4. The voltage change detection device according to claim 2, wherein the voltage change detection device generates the detection signal when the comparison potential is higher than the reference potential.

5. A voltage change detection device comprising:
   a reference potential generator that generates a reference potential based on a power supply potential;
   a comparison potential generator adapted to generate a comparison potential based on the power supply potential; and
   a detection signal generator adapted to generate a detection signal indicating that the power supply potential has changed to cross a predetermined detection potential according to a comparison between the reference potential and the comparison potential,
   wherein the reference potential generator includes one of a first resistor and a first constant current source connected to a ground potential and a first field effect transistor having a drain connected to the power supply potential, a source connected to the one of the first resistor and the first constant current source at a first node, and a gate connected to a fixed voltage,
   wherein the comparison potential generator includes one of a second resistor and a second constant current source connected to the ground potential, at least two second field effect transistors, each having a source connected to the one of the second resistor and the second constant current source at a second node, and at least two switches connected between the power supply potential and respective gates and drains of the second field effect transistors, and
   wherein the detection signal generator is adapted to generate the detection signal using a voltage at the first node as the reference potential and using a voltage at the second node as the comparison potential, and
   wherein the fixed voltage is the ground potential.

6. The voltage change detection device according to claim 5, wherein the first field effect transistor is a depletion type NMOS transistor and the second field effect transistor is an enhancement type NMOS transistor.

7. The voltage change detection device according to claim 5, wherein the voltage change detection device generates the detection signal when the comparison potential is higher than the reference potential.

8. The voltage change detection device according to claim 6, wherein the voltage change detection device generates the detection signal when the comparison potential is higher than the reference potential.

9. The voltage change detection device according to claim 5, wherein gate lengths or gate widths of the second field effect transistors are different from each other.

10. The voltage change detection device according to claim 6, wherein gate lengths or gate widths of the second field effect transistors are different from each other.

* * * * *